US006190930B1

(12) United States Patent
Williams

(10) Patent No.: US 6,190,930 B1
(45) Date of Patent: Feb. 20, 2001

(54) BUFFERED RESIST PROFILE ETCH OF A FIELD EMISSION DEVICE STRUCTURE

(75) Inventor: Terry N. Williams, Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/404,913

(22) Filed: Sep. 24, 1999

Related U.S. Application Data

(62) Division of application No. 09/022,763, filed on Feb. 12, 1998.

(51) Int. Cl.[7] ..................................................... H01L 21/00
(52) U.S. Cl. ................................. 438/20; 445/24; 445/50
(58) Field of Search ................................. 438/20; 445/24, 445/50

(56) References Cited

U.S. PATENT DOCUMENTS 5,229,331 * 7/1993 Doan et al. .......................... 437/228
5,653,619 8/1997 Cloud et al. .......................... 445/24
5,913,704 6/1999 Spindt et al. .......................... 445/24
5,965,898 10/1999 Jones et al. .......................... 257/10
5,993,281 11/1999 Musket .................................. 445/50

* cited by examiner

*Primary Examiner*—John F. Niebling
*Assistant Examiner*—Alexander G. Ghyka
(74) *Attorney, Agent, or Firm*—Workman, Nypegger & Seeley

(57) ABSTRACT

A method for forming an emitter tip for use in a field emission device. An emitter layer is provided over a substrate. The emitter layer is overlaid with a blanket dielectric which is in turn overlaid by a masking layer. In a first etching operation, a masking island and an underlying dielectric island are formed from the masking layer and the blanket dielectric, respectively. These islands serve as a masking structure during subsequent etching processes by which an emitter tip is formed from the emitter layer. Accordingly, a second etching operation is conducted, whereby an etch chemistry which exhibits both isotropic and anisotropic characteristics is used to remove a portion of the emitter layer by undercutting beneath the masking structure. A third etching operation is conducted, wherein the etch chemistry is substantially more anisotropic than the etch chemistry of the second etching operation. The second and third etches mobilize a portion of the masking layer and form an emitter tip from the emitter layer. The emitter tip has a substantially rectilinear vertical profile.

27 Claims, 5 Drawing Sheets

BUFFERED RESIST PROFILE ETCH OF A FIELD EMISSION DEVICE STRUCTURE

RELATED APPLICATIONS

This is a divisional application of U.S. patent application Ser. No. 09/022,763, filed on Feb. 12, 1998, titled "BUFFERED RESIST PROFILE ETCH OF A FIELD EMISSION DEVICE STRUCTURE", which is incorporated herein by reference.

BACKGROUND OF THE INVENTION

The present invention relates to semiconductor structures for visual displays. More particularly, the present invention relates to a field emission device. In particular, the present invention relates to fabrication of a field emitter tip.

THE RELEVANT TECHNOLOGY

Integrated circuits are currently manufactured by methods in which semiconductive structures, insulating structures, and electrically conductive structures are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term semiconductor substrate is contemplated to include such structures as silicon-on-insulator and silicon-on-sapphire. The term "substrate" refers to any supporting structure. As used herein, "field emission device" is defined to mean any construction for emitting electrons in the presence of an electrical field, including but not limited to an electron emission structure or tip either alone or in assemblies comprising other materials or structures.

Miniaturization of structures within integrated circuits focuses attention and effort to incorporating field emission devices within semiconductor substrates. A field emission device typically includes an electron emission structure, or tip, configured for emitting a flux of electrons upon application of an electric field to the field emission device. An array of miniaturized field emission devices can be arranged on a plate and used for forming a visual display on a display panel. For example, field emission devices may be used in making flat panel displays for providing visual display for computers, telecommunication, and other graphics applications. Flat panel displays typically have a greatly reduced thickness compared to cathode ray tubes.

U.S. Pat. No. 5,635,619 issued to Cloud et al. and U.S. Pat. No. 5,229,331 issued to Doan et al. disclose field emission devices. The foregoing patents are hereby incorporated by reference for purposes of disclosure. A general view of a field emission device (FED) much like those that are disclosed in the foregoing patents to Cloud et al. and Doan et al. particularly as geometries become relatively small, is seen in FIG. 1. The FED employs a cold cathode and includes a substrate 28, which can be composed of glass, for example, or any of a variety of other suitable materials. A cathode conductive layer 30, such as doped polycrystalline silicon, is deposited onto substrate 28.

At a field emission site location, an emitter tip 14, which is a micro-cathode, is constructed over substrate 28. A variety of shapes have been used for emitter tip 14, so long as the emitter tip 14 tapers to a relatively fine point.

Surrounding emitter tip 14 is a low potential anode gate structure 38, which is separated from cathode conductive layer 30 by means of a dielectric layer 34.

When a voltage differential is applied between emitter tip 14 and anode gate structure 38 using, for example, voltage source 32, an electron flux 24 is emitted and accelerates toward an anode panel 26. The anode panel 26 includes a transparent panel 44, such as glass; a phospholuminescent panel 48; and an anode conductive layer 46, which is electrically connected to source 32. The electron flux 24 strikes and excites the phospholuminescent panel 48, thereby causing light 24 to be emitted and to pass through transparent panel 44.

The coordinated activity of a plurality of emitter tips 14 arrayed over a flat panel display provides a visual display that may be viewed by a user. Each individual or cluster of emitter tips 14 that is provided on a flat panel display may be assigned a unique matrix address. When such a flat panel display is used, the emitter tips 14 are systematically activated by means of their matrix addresses in order to provide the desired visual display.

Significant problems with emitter tip 14 in the above described device are evident in the prior art due to shrinking geometries. As seen in FIG. 1, manufacturing processes that are commonly used in the prior art typically form an emitter tip 14 that has a curvilinear vertical profile. FIG. 2 illustrates an intermediate stage in the formation of emitter tip and further depicts the curvilinear vertical profile thereof. In FIG. 2, the intermediate semiconductor structure 10 comprises cathode conductive layer 30, emitter tip 14, and a hard mask 16 that covers emitter tip 14 prior to its removal. It can be seen that emitter tip 14 includes wings 18 that cause the vertical profile of emitter tip 14 to be curvilinear instead of rectilinear. Wings 18 are unintentional but persistent products of conventional methods of forming emitter tip 14. Emitter tips 14 that have pronounced curvilinear vertical profiles have been found to provide sub-grade performance compared to those that are more nearly rectilinear.

Emitter tip 14 is exposed to the etch gas at large, but it encounters two types of etch gas molecules. A primary collision etch gas molecule 8 (its trajectory illustrated) collides with emitter tip 14 by coming from the etch gas at large. A secondary collision etch gas molecule 12 (its trajectory illustrated) comes from the etch gas at large but it collides with and rebounds from hard mask 16 near the intersection of emitter tip 14 and hard mask 16 just prior to its etch collision with emitter tip 14. Because the etch is selective to hard mask 16, the secondary collision etch gas molecule 12 rebounds from hard mask 16 and, along with primary collision etch gas molecule 8, causes an intensified frequency of collisions into emitter tip 14 in the region of the intersection between hard mask 16 and emitter tip 14. The intensified frequency of collisions into emitter tip 14 by secondary collision etch gas molecule 12 in addition to primary collision etch gas molecule causes increased etching of emitter tip 14 in this region. The increased etching in this region is exacerbated by the increase in surface area that is formed due to both primary- and secondary-collision etch gas molecules. Further, the extinguishment of secondary etch gas molecule 12 causes an etch gas sink which intensifies etching in this region. Hence, wings 18 form because of intensified etching activity in the region of emitter tip 14 near hard mask 16.

As geometries continue to shrink to the point that the mean free path of secondary etch gas molecule 12 is greater than the distance from its collision point on hard mask 16 to emitter tip 14, the problem is only made more pronounced. Additionally, as wings 18 begin to form against hard mask 16, the surface area of emitter tip 14 above wings 18 increases. The increased surface area makes for increased primary and secondary etch gas molecules that collide with emitter tip 14 in this region. This increases etching in this region as compared to the region below wings 18.

In the prior art, hard mask 16 was formed by patterning a photoresist upon an oxide layer, etching to form hard mask 16, and stripping the photoresist. Problems of a curvilinear profile arose in part from etching difficulties as emitter tip geometries continued to shrink. Achieving a substantially rectilinear profile became more elusive as geometries shrank and it became more and more challenging to get an undercutting etch beneath hard mask 16 so as to yield an emitter tip having a rectilinear profile. Because an undercutting etch is a preferred method of achieving emitter tip 14, what is needed in the art is a method of forming a substantially rectilinear profile of an emitter tip as geometries continue to shrink.

SUMMARY OF THE INVENTION

The present invention relates to formation of an emitter tip that overcomes the problems in the prior art. A substrate is provided, and a cathode conductive layer is formed thereupon. An emitter layer is formed on the resistive layer. The emitter layer may be any material from which electron emission structures may be formed, especially those materials having a relatively low work function, so that a low applied voltage will induce a relatively high electron flux therefrom. An emitter tip is formed according to the inventive method. In a first procedure, the emitter layer is overlaid with a blanket dielectric which is in turn overlaid by a masking layer and patterned into a masking island according to a size that is dictated by dimensions of the emitter tip to be formed.

In a first etching stage, the masking island is used to etch substantially anisotropically into the oxide to form the oxide island that has substantially the same "footprint" as the masking island.

In a second etching stage, the emitter layer is etched with an etch recipe that is selective to the underlying structure which is positioned beneath the emitter layer. Selectivity of the second etching stage recipe to the masking island is not as great as the selectivity thereof to the oxide island and to the underlying structure. The characteristics of this second etching stage are such that both isotropic and anisotropic qualities are exhibited in the etch recipe. By this combination of qualities, both penetration through the emitter layer and undercutting beneath the oxide island are achieved. In a preferred embodiment, the second etching stage is carried out under etching conditions with the following preferred etching characteristics. Firstly, the directional qualities of the second etching stage etch recipe, as set forth above, include both isotropic and anisotropic characteristics. Secondly, partial mobilization of the masking island creates a skirt region that substantially alters the etch gas that it encounters.

In a third etching stage, selectivity of the etch recipe to the masking island is configured to be lower than in the second etching stage. Additionally, the third etching stage is carried out under conditions that are substantially more anisotropic than in the second etching stage.

An advantage of the inventive method over the prior art is that the masking island does not need to be removed during the inventive etching stages. Additionally according to the present invention, selection of an application-specific chemistry for the masking island prepares the emitter layer for the buffered etching of the second and third etching stages that provide another advantage of a more rectilinear etched profile of the emitter tip.

The present invention has application to a wide variety of field emission devices other than those specifically described herein. In particular, achievement of the emitter tip with a substantially rectilinear profile increases the efficiency of electron emission and therefore lowers the power and increases the ability to achieve higher refresh rates for a video display application.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to a method of forming an FED that overcomes the problems of the prior art. In particular, the present invention includes a method for constructing a cathode structure in the form of a conical, tapered emitter tip for use in a field emission device. Reference will now be made to the drawings wherein like structures will be provided with like reference designations. It is to be understood that the drawings are diagrammatic and schematic representations of the embodiment of the present invention and are not drawn to scale.

In practice, emitter tips are typically formed in physical relationship with a number of other structures that together form a field emission device. Multiple field emission devices may be arranged to form a flat panel display or other visual display device. However, the methods disclosed herein are generally applicable to the formation of substantially any emitter tip that is to have a tapered structure and a substantially rectilinear vertical profile, regardless of the other particular features of the field emission device or other structure in which it is to be used. Accordingly, although examples are disclosed hereinafter of specific field emission devices that include an emitter tip formed according to the methods of the invention, it is to be understood that the invention is generally applicable to forming emitter tips that may be used in a wide variety of field emission devices.

Figure 3:
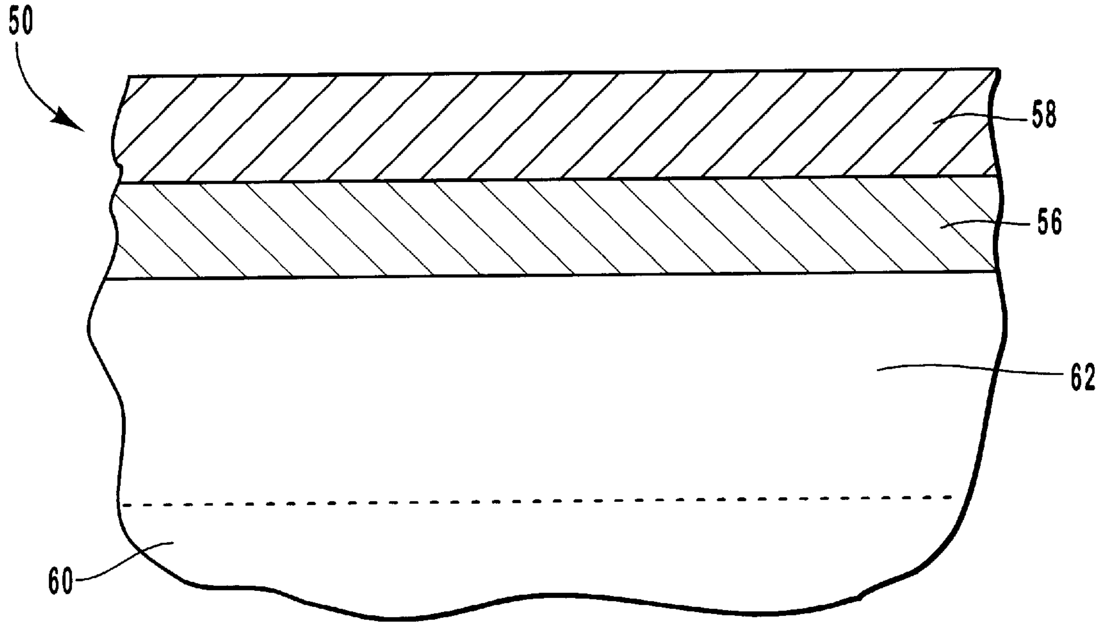
FIG. 3 is an elevational cross-section view of a precursor structure for forming an emitter tip according to the present invention, wherein an emitter layer is formed over a substrate and wherein a blanket dielectric layer and a masking layer are successively formed over the emitter layer.

FIG. 3 illustrates a multi-layer structure 50 having undergone several initial steps in the process of forming an FED according to a preferred embodiment of the invention. A substrate is provided, and is preferably a P-type silicon wafer having formed therein (by suitable known doping pretreatment) a series of elongated, parallel extending opposite N-type conductivity regions, or wells. Each N-type conductivity strip has a width of approximately 10 microns, and depth of approximately 3 microns. The spacing of the strips is arbitrary and can be adjusted to accommodate a desired number of field emission cathode sites to be formed on a given size silicon wafer substrate.

Processing of the substrate to provide the P-type and N-type conductivity regions may be by any suitable semiconductor processing techniques, such as diffusion and/or epitaxial growth. If desired, the P-type and N-type regions, of course, can be reversed through the use of a suitable starting substrate and appropriate dopants.

The N-type or P-type conductivity strips, or wells, are to be the sites at which emitter tips are to be formed. As such, each conductivity strip constitutes a emitter layer 62, from which material is to be selectively removed in order to construct emitter tips. It will be understood that an emitter layer 62 may be provided upon a substrate according to alternative procedures other than the above-described process of forming doped wells or strips within the substrate. For example, a conformal layer of doped polysilicon may be deposited or otherwise formed over a substrate in order to provide an emitter layer 62 from which an emitter tip is to be constructed.

Figure 4:
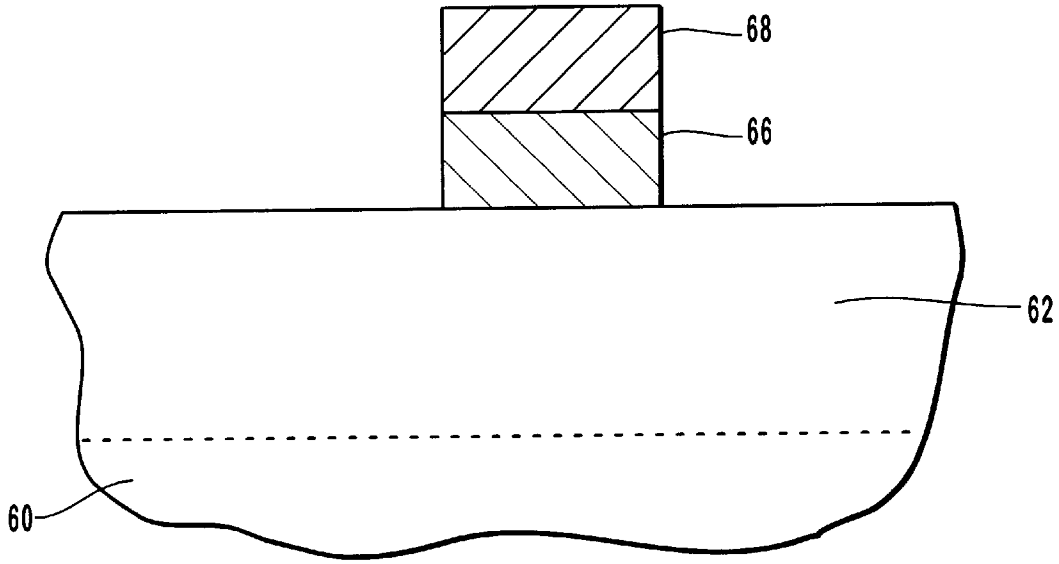
FIG. 4 is an elevational cross-section view of the structure depicted in FIG. 3 after further processing, wherein an oxide island has been formed upon the emitter layer by patterning the masking layer and subsequently etching a portion of the blanket dielectric layer.

Regardless of the preliminary steps conducted to provide emitter layer 62, the method of forming an emitter tip therefrom is illustrated in FIGS. 3–6 and is described hereinafter. In a first procedure seen in FIG. 3, emitter layer 62 is overlaid with a blanket dielectric 56 such as, by way of non-limiting example, an oxide. The oxide is overlaid by a masking layer 58 and patterned into a masking island 68 as seen in FIG. 4 according to a size that is dictated by the desired dimensions of emitter tip that is to be formed.

In a first etching stage, masking island 68 is used to etch substantially anisotropically into the oxide to form oxide island 66 that has substantially the same "footprint" as masking island 68 as seen in FIG. 4. The etch to form oxide island 66 is highly selective to masking island 68 and is also configured to stop on emitter layer 62. By way of non-limiting example. oxide island 66 is formed by an oxide dry etch. In this way, oxide island 66 is formed according to specifications.

In a second etching stage, emitter layer 62 is etched with an etch recipe that is selective to the structure beneath emitter layer 62, where a discrete structure is to provide a base upon which an emitter tip will rest. In this example, the discrete structure comprises underlying structure 60, which may be a portion of a polysilicon substrate that is doped differently than emitter layer 62. Selectivity of the second etching stage recipe to masking island 68 is not as great as the selectivity thereof to oxide island 66 and to underlying structure 60.

The characteristics of this second etching stage are such that both isotropic and anisotropic qualities are exhibited in the etch recipe. By this combination of qualities, both penetration through emitter layer 62 and undercutting beneath oxide island 66 are achieved. Additionally, the second etching stage is not as selective to masking island 68 as is the first etching stage. This causes masking island 68 to begin to become mobilized at this second etching stage.

The etch chemistry may be selected to a preferred single etch gas under conditions that achieve both isotropic and anisotropic etch qualities. Alternatively, a mixture of etch gases may be selected along with other etch conditions such that a gas that etches isotropically is mixed with a major amount of a gas that etches anisotropically. Selection of conditions, whether with a single gas or with a gas mixture will depend upon the specific application. The specific application will depend upon the chemical makeup of the structures that are being removed and those that are to act as etch stops.

By way of nonlimiting example, the second etching stage is carried out under plasma enhanced etching conditions. Where a plasma is generated during an etch, etch temperatures may be carried out in a lower range than otherwise. Under these conditions, temperatures are sufficiently low so as to not substantially volatilize masking island 68.

Figure 5:
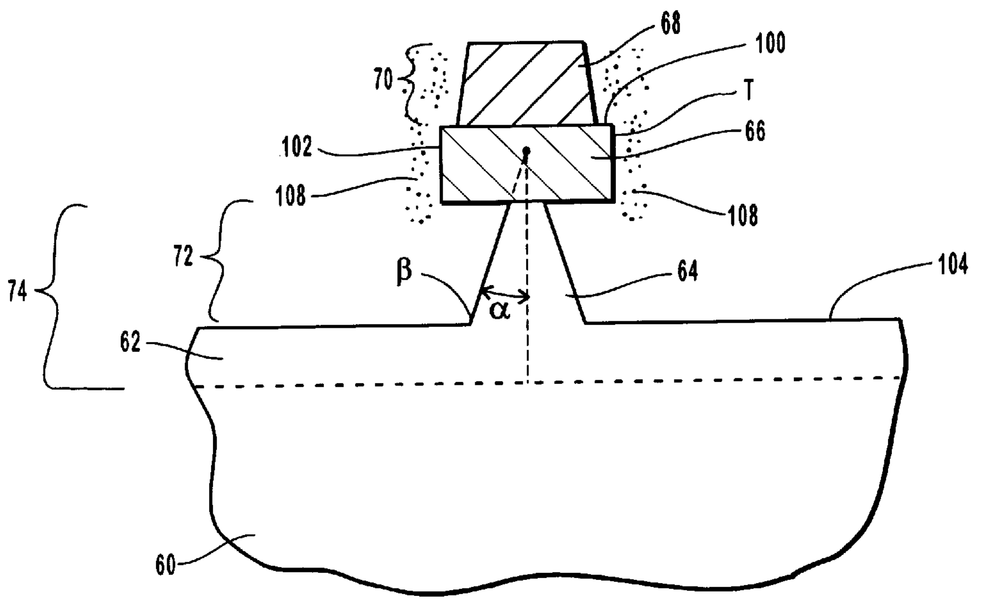
FIG. 5 is an elevational cross-section view of the structure depicted in FIG. 4 according to the present invention after further processing, wherein both isotropic and anisotropic etching is carried out to form a substantially rectilinear vertical etched profile of the emitter tip, wherein at least a portion of the masking island material is mobilized to protect and buffer the oxide island.

FIG. 5 depicts formation of emitter tip 64 at a point that is during the second etching stage. A fraction of masking island 68 has become mobilized by as seen by a slight tapering thereof. Although no single theory is relied upon, mobilization of a fraction of masking island 68 apparently causes the mobilized portion to act as a buffer to the etch gas or etch gases. Control of the buffering effect of a partial mobilization of masking island 68, in addition to selection of an etch gas or to selection of a mixture of etch gases, may be affected positively by selecting the step height 70 of masking island 68. Where a higher step height 70 is formed, an increased surface area will be available to be mobilized during the second etching stage.

In a preferred embodiment of the present invention, the second etching stage is carried out under etching conditions with the following preferred etching characteristics. Firstly, the directional qualities of the second etching stage etch recipe, as set forth above, include both isotropic and anisotropic characteristics. Secondly, partial mobilization of masking island 68 creates a skirt region 108, that substantially alters the etch gas, and that extends downwardly from the upper surface 100 and the lateral edge 102 of oxide island 66. Skirt region 108 of the substantially altered etching gas extends downwardly toward the receding surface 104 of emitter layer 62.

As lateral diffusion of etching gas through skirt region 108 occurs, the etching gas is substantially altered so as to be highly selective to oxide island 66 but the etching gas retains isotropic etching characteristics that continue to cause a substantially rectilinear etched profile of emitter tip 64. By such etching characteristics caused by mobilization of masking island 68 and its protection of oxide island 66 during the second etching stage, a substantially conical shape is achieved in emitter tip 64. From a point T at the top of emitter tip 64 to a point B at the base of emitter tip 64, a line can be drawn that makes a particular angle $\alpha$, as seen in FIG. 5. The angle $\alpha$ is measured from an axis perpendicular to the general plane formed of emitter layer 62 and is preferred to be in a range from about 20 degrees to about 600 degrees. More preferably, the angle is in a range from about 25 degrees to about 40 degrees, and most preferably about 25 degrees to about 30 degrees.

In a third etching stage, selectivity of the etch recipe to masking island 68 is configured to be lower than in the second etching stage. Additionally, the third etching stage is carried out under conditions that are substantially more anisotropic than in the second etching stage. Where underlying structure 60 is present, an etch recipe is configured to stop on underlying structure 60, but that will mobilize a portion of masking island 68 to a greater degree than mobilization thereof that is achieved in the second etching stage.

In this third etching stage, it is useful to protect masking island 68 from etching after a manner that allows for continued undercutting beneath masking island 68 while simultaneously protecting masking island 68 by the buffering effect thereon of a partially mobilized masking island 68. Where underlying structure 60 is not present, etching conditions are selected to stop etching when a preferred height of emitter tip 64 has been achieved.

During the third etching stage, about two-thirds of the height of emitter tip 64 is achieved by removing substantially all of the remainder of emitter layer 62 down to stop on underlying structure 60 if underlying structure 60 is present. In FIG. 5, it can be seen that a second etching stage tip profile height 72 has exposed emitter tip 64 to a level above underlying structure 60. A third etching stage tip profile height 74 is also illustrated as an alternative target profile height. Whether underlying structure 60 is present or not, whether any or all structures beneath emitter layer 62 are present or not, or whether it is desirable or not to leave at least a portion of emitter layer 62 as illustrated in FIG. 5, the third etching stage is carried out in which about two thirds of the final height of emitter tip 64 is formed.

An advantage of the inventive method over the prior art is the selection of masking island 68 that does not need to be removed during the inventive etching stages. By retaining the photoresist of masking island 68, if masking island 68 is composed of photoresist, additional steps of stripping masking island 68 and a series of cleans are eliminated. Additionally according to the present invention, selection of an application-specific chemistry for masking island 68 prepares emitter layer 62 for the buffered etching of the second and third etching stages that provide another advantage of a more rectilinear etched profile of emitter tip 64.

At the substantial completion of the third etching stage, where masking island 68 comprises a positive photoresist of a novalac resin and a photosensitizer, masking island 68 has been attrited by about one-fourth its original mass. While no single theory is to be relied upon, it is considered useful to assume that the mobilized masking island 68 substantially diminishes the effect of the etch recipe of the third etching stage to remove substantially any of oxide island 66 in the region of the undercut such that a substantially rectilinear emitter tip profile is formed.

Figure 6:
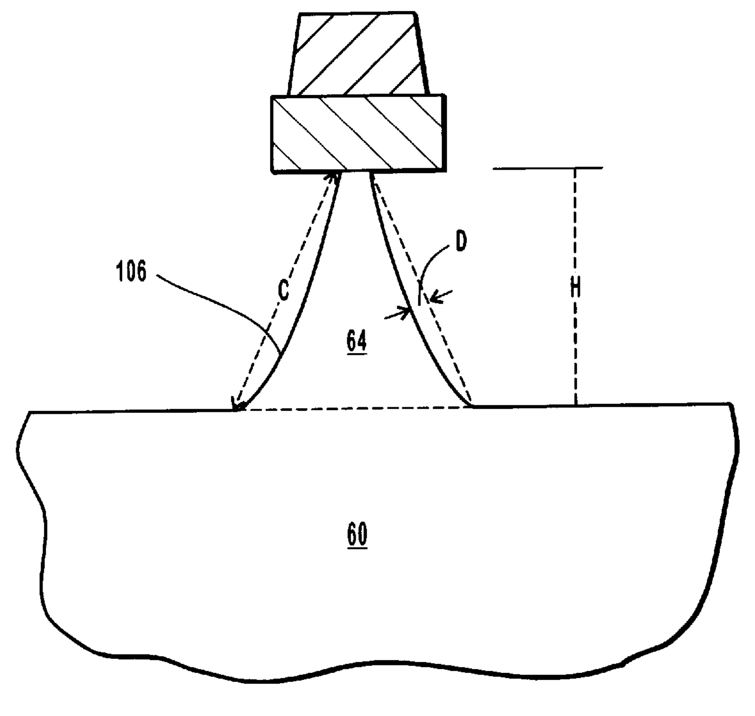
FIG. 6 is an elevational cross-section view of an emitter tip according to an embodiment achieved by the inventive method, wherein it can be seen that the emitter tip has a substantially paraboloid vertical profile that arcs in a concave fashion or of a section of a geometric oval fashion. The concave or oval section shape extends between a substrate below the emitter tip and a hard mask at the apex of the emitter tip.

FIG. 6 illustrates one achieved embodiment of the present invention according to the inventive method following completion of the third etching stage. For illustrative purposes, the vertical profile of emitter tip 64 is exaggerated to illustrate a deviation from absolute rectilinearity. In FIG. 6 it can be seen that emitter tip 64 has an emitter tip profile 106 that has an arc length L and a cord length C. Emitter tip 64 has a height H and emitter tip profile 106 has a parabolic or oval sectional shape that subtends from the linearity of cord length C by a depth D. Emitter tip 64, formed by the method of the present invention, avoids the formation of wings 18 as illustrated in the prior art by having a substantially rectilinear profile. The example of FIG. 6 is presented to illustrate an example of substantial rectilinearity under the invention when the vertical profile of emitter tip deviates from absolute rectilinearity.

Under substantially ideal conditions, arc length L and cord length C are substantially the same. Under substantially ideal conditions, the subtending of emitter tip profile 106 away from cord length C will deviate by a depth of about D=0. In a preferred embodiment of the present invention the ratio of arc length L over cord length C is less than or equal to about 1.2:1. More preferably, the ratio of arc length L to cord length C is less than or equal to about 1.1:1. Even more preferably the ratio of arc length L to cord length C is less than or equal to about 1.05:1. Most preferably, the ratio of arc length L over cord length C is less than or equal to about 1.01:1.

According to the method of the present invention, as emitter tip 64 is formed in the second etching stage and the third etching stage, the buffering effect caused by mobilization of masking island 68 tends to diminish the isotropic etching effects of the second etching stage in regions of emitter tip 64 near oxide island 66. As etching away from oxide island 66 in the direction of underlying structure 60 is carried out, the buffering effects of mobilized masking island 68 is reduced.

In the inventive method, secondary collision etch gas molecules are substantially reduced. The reduction of secondary collision etch gas molecules 12 may be caused by such molecules being chemically neutralized as they collide with molecules from the mobilized portions of masking island 66. The reduction of secondary collision etch gas molecules 12 may also be caused by would-be secondary collision etch gas molecules 12 that transfer their momentum to molecules of mobilized portions of masking island in skirt region 108.

Figure 1:
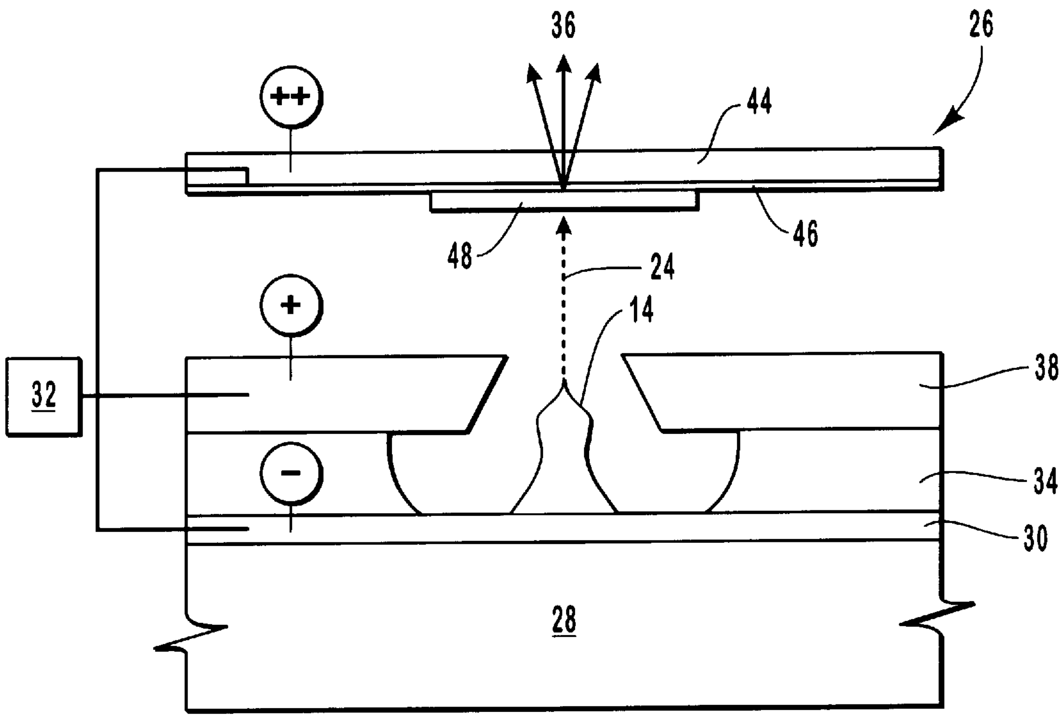
FIG. 1 (PRIOR ART)
FIG. 1 is a prior art cross-sectional elevation view of a conventional field emission device, whereby it can be seen that an emitter tip has a substantially curvilinear vertical profile due to increasing etch difficulties that are encountered as geometries continue to shrink.
Figure 2:
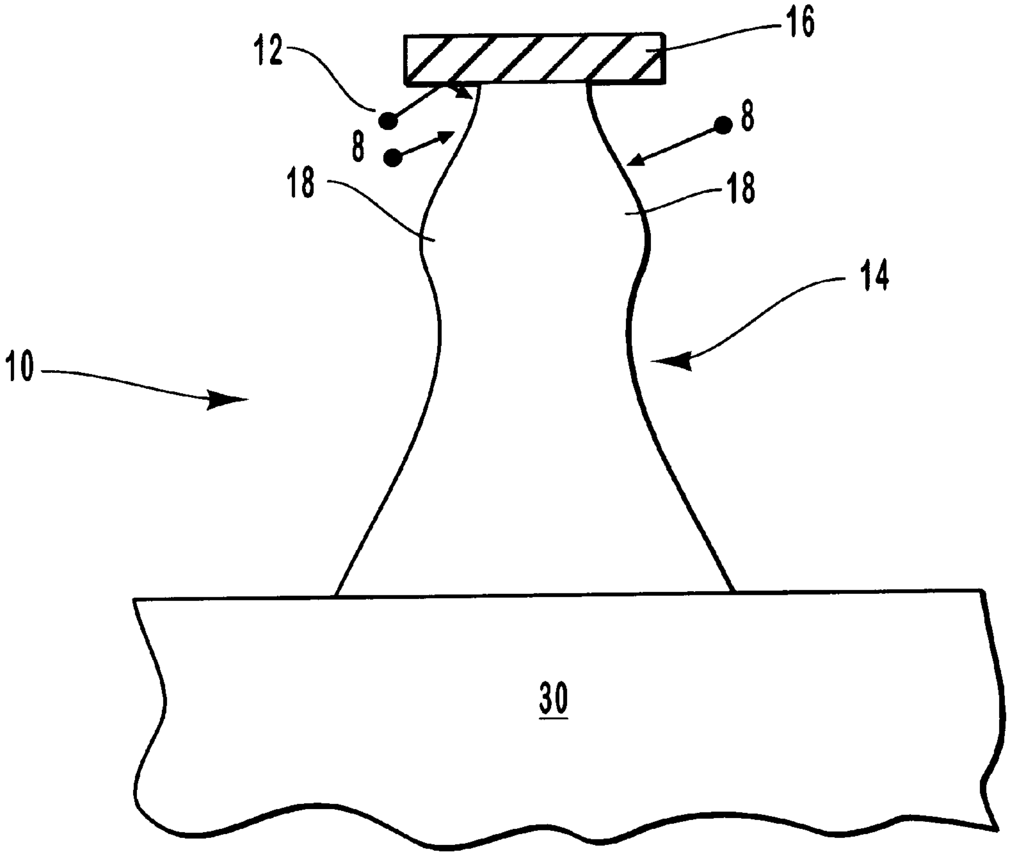
FIG. 2 (PRIOR ART)
FIG. 2 is a elevational cross-section view of an emitter tip in an intermediate processing stage according to the problem depicted in the prior art, wherein it can be seen that the emitter tip has a swollen or winged portion.
Figure 7:
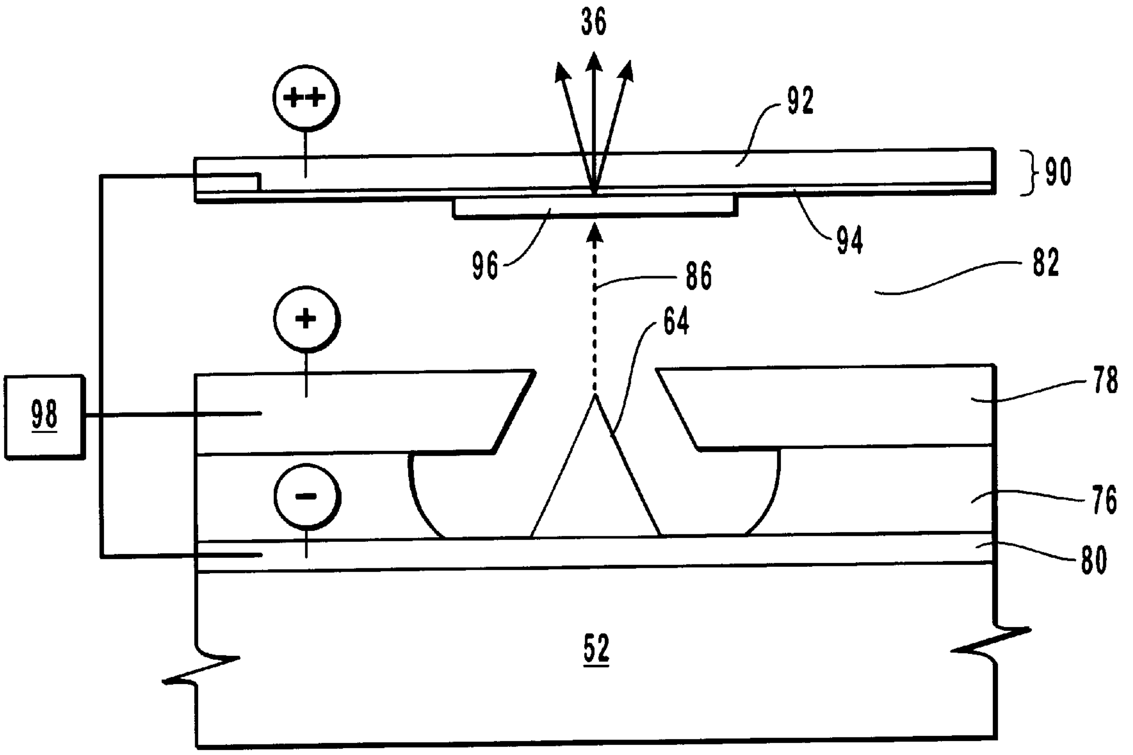
FIG. 7 is an elevational cross-section view of the structure depicted in FIG. 5 after further processing, wherein a completed field emission device is provided and includes an emitter tip formed according to the invention.

Following formation of emitter tip 64, further processing may be carried out in order to construct, in the vicinity of emitter tip 64, structures that enable an electric field to be applied to emitter tip 64 such that an electron flux is emitted therefrom. It will be understood that any of a number of structures and corresponding processes may be used according to the invention to form the aforementioned structures in the vicinity of emitter tip 64. For example, FIG. 7 illustrates a partial cross section of a completed flat panel display that includes emitter tip 64 as part of a field emission device. It may be noted that the structure of FIG. 7 is substantially similar in many aspects to the structure of FIG. 1, with the marked difference of the substantial rectilinearity of emitter tip 64 of FIG. 7, which is a result of the inventive method.

Accordingly, an advantageous method that may be used to construct a completed field emission device after emitter tip 64 has been formed is described in U.S. Pat. Nos. 5,653,619 and 5,229,331. In particular, such methods result in a field emission device that includes a dielectric layer 76 that separates, physically and electrically, a conductive gate structure 78 from cathode conductive layer 80. An anode panel 90 is positioned over conductive gate structure 78 and is separated therefrom by a substantial vacuum 82. Anode panel 90 includes a transparent panel 92, an anode conductive layer 94, and a phospholuminescent panel 96.

While as few as one emitter tip 64 may be formed, in practice, it is common to form an array of as many as tens of millions or more of emitter tips 64 over a substrate. The formation of emitter tip 64 as illustrated in FIGS. 6 and 7, such that wings have been avoided and emitter tip 64 has a substantially rectilinear vertical profile, provides a geometry that is highly efficient for generating an electron flux. In particular, the localized work function of the material that constitutes emitter tip 64 is relatively low at the apex of the emitter tip 64. As a result, a relatively high electron flux 86 can be generated from a given voltage, and electron emission will be substantially limited to the apex.

For the purpose of achieving a substantially rectilinear profile for emitter tip 64, it should first be recognized that economic considerations encourage manufacturing processes that have high product throughput. The present invention provides distinct advantages over the prior art in decreasing processing time and costs. By the methods of the prior art, several steps were required to prepare hard mask 16 for an etching process that formed emitter tip 14. Patterning of hard mask 16 was required by use of a photoresist. Following formation of the hard mask, several steps of photoresist removal and cleaning were required.

One advantage of the present invention over the prior art is selection of a preferred material to form masking island 68 whereby oxide island 66 is formed but that simultaneously provides a preferred processing path that avoids the need to strip masking island 68 and several subsequent steps of cleaning multilayer structure 50. Thus, masking island 68 is first used as a masking means in the formation of oxide island 66. According to the inventive method, masking island 68 is next used as a buffering means to assist during the second etching stage and the third etching stage to achieve emitter tip 64 that has a substantially rectilinear profile.

Where third stage tip profile height 74 may be higher than previous applications, mask step height 70 may be increased to provide additional surface area of masking island 68 that can be mobilized to act as a buffer medium during the second etching stage and the third etching stage. Where third stage tip profile height 74 is shorter than that achieved previously, such as during a miniaturization effort, mask step height 70 may be decreased, thus providing a smaller surface area of masking island 68 that can be mobilized during the formation of emitter tip 64. Thus, the process engineer may select processing conditions to achieve a preferred degree of mobilization of the photoresist making up masking island 68.

A field emission device that includes emitter tip 64 formed according to the invention may be used in the customary manner to produce visible light. In particular emitter tip 64 and an associated field emission device are used by applying voltages to cathode conductive layer 80, conductive gate structure 78 and anode conductive layer 94 by means of voltage source 98. Preferably, the voltage applied to conductive gate structure 78 is positive with respect to the voltage applied to cathode conductive layer 80. The voltage applied to anode conductive layer 94 should also be positive, but with a significantly greater magnitude than that of conductive gate structure 78. This significantly higher voltage causes electrons emitted from emitter tip 64 to be accelerated toward anode panel 90 such that they strike phospholuminescent panel 96. Electron flux 86 excites the material of phospholuminescent panel 96 such that visible light is emitted therefrom.

The present invention has application to a wide variety of field emission devices other than those specifically described herein. In particular, achievement of emitter tip 64 with a substantially rectilinear profile increases the efficiency of electron emission and therefore lowers the power and increases the ability to achieve higher refresh rates for a video display application.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming a field emission cathode structure of a field emission device, said method comprising:

patterning a first layer to form a patterned first layer, said first layer being disposed upon a second layer, said second layer being disposed upon a third layer;

patterning said second layer to form a patterned second layer that is determined by said patterned first layer; and removing a portion of said third layer such that said patterned first layer is partially mobilized and said patterned second layer is substantially not mobilized, wherein said third layer is removed by undercutting beneath said patterned second layer, and wherein said third layer forms a conical structure having a tapered, substantially rectilinear removal profile beneath said patterned second layer.

2. A method according to claim 1, wherein said first layer comprises a photoresist.

3. A method according to claim 1, wherein said second layer comprises silicon dioxide.

4. A method according to claim 1, wherein said second layer comprises silicon dioxide and is formed by thermal conversion of said third layer.

5. A method according to claim 1, wherein said second layer comprises silicon dioxide, said second layer being formed by chemical vapor deposition upon said third layer.

6. A method according to claim 1, wherein said third layer comprises silicon.

7. A method according to claim 1, wherein said silicon of said third layer is doped with at least one of phosphorus and boron.

8. A method according to claim 1, wherein said tapered, substantially rectilinear removal profile terminates at a top point and terminates at an opposite bottom point at said second layer, wherein a line between said top point and bottom point has an angle that deviates from an axis perpendicular to the plane of said first layer, said second layer, and said third layer in a range from about 20 degrees to about 60 degrees.

9. A method according to claim 8, wherein said angle deviates from said axis in a range from about 25 degrees to about 40 degrees.

10. A method according to claim 8, wherein said angle deviates from said axis by about 25 degrees to about 30 degrees.

11. A method of forming a field emission cathode structure of a field emission device, said method comprising:

patterning a first layer to form a patterned first layer, said first layer being disposed upon a second layer, said second layer being disposed upon a third layer;

patterning said second layer to form a patterned second layer, whereby said patterned first layer determines said patterned second layer;

removing a first portion of said third layer with a first removal chemistry, said first removal chemistry having both anisotropic and isotropic removal properties, whereby a first vertical removal depth comprises about one part in three; and removing a second portion of said third layer with a second removal chemistry, said second removal chemistry having substantially anisotropic removal properties, wherein a second vertical removal depth comprises about two parts in three, wherein said patterned first layer is partially mobilized and said patterned second layer is substantially not mobilized, wherein said third layer is removed by undercutting beneath said patterned second layer, and wherein said third layer has a conical structure and forms a tapered, substantially rectilinear removal profile beneath said patterned second layer.

12. A method of forming a field emission cathode structure of a field emission device, said method comprising:

forming a substrate;

forming a cathode conductive layer upon said substrate;

forming a third layer positioned over said cathode conductive layer;

forming a second layer disposed upon said third layer;

patterning a first layer to form a patterned first layer, said first layer being disposed upon said second layer;

patterning said second layer to form a patterned second layer, whereby said patterned first layer determines said patterned second layer; and removing a portion of said third layer, wherein said patterned first layer is partially mobilized and said patterned second layer is substantially not mobilized, wherein said third layer is removed by undercutting beneath said patterned second layer, and wherein said third layer has a conical structure and forms a tapered, substantially rectilinear removal profile beneath said patterned second layer.

13. A method according to claim 12, further comprising, after removing said portion of said third layer:

forming a conductive gate structure over said cathode conductive layer, said conductive gate structure being separated from said cathode conductive layer by a dielectric layer; and forming an aperture in said conductive gate structure, said conical structure being exposed through said aperture.

14. A method according to claim 13, further comprising providing an anode panel separated from said conductive gate structure and said conical structure by a substantial vacuum, said anode panel including a phospholuminescent material.

15. A method of forming a field emission cathode structure of a field emission device, said method comprising:

forming a substrate;

forming a cathode conductive layer upon said substrate;

forming a third layer positioned over said cathode conductive layer;

forming a second layer disposed upon said third layer;

patterning a first layer to form a patterned first layer, said first layer being disposed upon said second layer;

patterning said second layer to form a patterned second layer, whereby said patterned first layer determines said patterned second layer;

removing a first portion of said third layer with a first removal chemistry, said first removal chemistry having both anisotropic and isotropic removal properties, wherein a first vertical removal depth comprises about one part in three; and removing a second portion of said third layer with a second removal chemistry, said second removal chemistry having substantially anisotropic removal properties, wherein:

a second vertical removal depth comprises about two parts in three;

said patterned first layer is partially mobilized and said patterned second layer is substantially not mobilized;

said second portion of said third layer is removed by undercutting beneath said patterned second layer; and said third layer has a conical structure having a tapered, substantially rectilinear removal profile beneath said patterned second layer.

16. A method according to claim 15, further comprising, after removing said second portion of said third layer:

forming a dielectric layer over said cathode conductive layer;

forming a conductive gate structure over said dielectric layer; and forming an aperture through both of said dielectric layer and said conductive gate structure, said conical structure being exposed through said aperture.

17. A method of forming a field emission device comprising:

patterning a mask, said mask being disposed upon a blanket oxide, said blanket oxide being disposed upon an emitter layer; and patterning said blanket oxide, whereby said mask determines patterning said blanket oxide;

removing a portion of said emitter layer, wherein:

said mask is partially mobilized;

said portion of said emitter layer is removed by undercutting beneath said blanket oxide; and said partially mobilized mask diminishes etching by secondary collisions.

18. A method of forming a field emission device according to claim 17, wherein said mask comprises a positive photoresist of a novalac resin and a photosensitizer.

19. A method of forming a field emission device according to claim 17, wherein emitter layer is a semiconductive material.

20. A method of forming a field emission device according to claim 17, wherein said emitter layer comprises silicon that is doped with at least one of phosphorus and boron.

21. A method of forming a field emission device according to claim 17, wherein removing said portion of said emitter layer is conducted such that a conical structure having a tapered, substantially rectilinear removal profile is formed from said emitter layer in a position below said blanket oxide.

22. A method of forming a field emission device comprising:

patterning a mask, said mask being disposed upon a blanket oxide, said blanket oxide being disposed upon an emitter layer;

patterning said blanket oxide, whereby said mask determines patterning said blanket oxide;

removing a first portion of said emitter layer under simultaneous anisotropic and isotropic removal conditions; and removing a second portion of said emitter layer under substantially anisotropic removal conditions, wherein said mask is partially mobilized, said second portion of said emitter layer is removed by undercutting beneath said blanket oxide, and said partially mobilized mask diminishes etching by secondary collisions.

23. A method of forming a flat panel display, comprising:

providing a substrate;

forming an emitter layer over said substrate;

forming a blanket oxide layer over said emitter layer;

forming a masking layer over said blanket oxide layer; and forming an array of emitter tips from said emitter layer, including:

patterning said masking layer to form therefrom an array of discrete masking islands;

patterning said blanket oxide layer to form therefrom an array of discrete oxide islands, each of said oxide islands being vertically aligned with one of said masking islands; and removing a portion of said emitter layer, wherein each of said discrete masking islands is partially mobilized and said oxide islands are substantially not mobilized, said portion of said emitter layer being removed by undercutting beneath said oxide islands, thereby forming said array of said emitter tips, each of said emitter tips having a substantially rectilinear vertical profile.

24. A method according to claim 23, further comprising, prior to forming said emitter layer, forming a cathode conductive layer over said substrate.

25. A method according to claim 24, further comprising, after forming said array of said emitter tips, forming a conductive gate structure over said cathode conductive layer.

26. A method according to claim 25, further comprising, after forming said conductive gate structure, disposing an anode panel that includes a phospholuminescent material over said conductive gate structure, said anode panel being separated from said conductive gate structure and from said emitter tips by a substantial vacuum.

27. A method according to claim 26, further comprising, after disposing said anode panel, electrically connecting a voltage source with each of said cathode conductive layer, said conductive gate structure, and said anode panel.

* * * * *

UNITED STATES PATENT AND TRADEMARK OFFICE

CERTIFICATE OF CORRECTION

PATENT NO. : 6,190,930 B1
DATED : February 20, 2001
INVENTOR(S) : Terry N. Williams It is certified that error appears in the above-identified patent and that said Letters Patent is hereby corrected as shown below:

Column 6,
Line 10, before "oxide island" change "example." to -- example, --

Signed and Sealed this

Twenty-sixth Day of February, 2002

Attest:

JAMES E. ROGAN

*Attesting Officer*

*Director of the United States Patent and Trademark Office*